United States Patent [19]

Kuroki et al.

[11] Patent Number: 4,504,148

[45] Date of Patent: Mar. 12, 1985

[54] SYSTEM FOR DETECTING A SIGNAL FOR ALIGNING TWO BODIES AND SIGNAL PROCESSING METHOD

[75] Inventors: Yoichi Kuroki; Yukihiro Yoshinari, both of Kawasaki; Ryozo Hiraga, Yokohama, all of Japan

[73] Assignee: Canon Kabushiki Kaisha, Tokyo, Japan

[21] Appl. No.: 435,959

[22] Filed: Oct. 22, 1982

[30] Foreign Application Priority Data

Oct. 28, 1981 [JP] Japan ................................ 56-172456

[51] Int. Cl.³ ............................................ G01N 21/30
[52] U.S. Cl. ..................... 356/401; 356/400; 250/557
[58] Field of Search ............. 356/399, 400, 401; 250/548, 557; 377/50; 307/234

[56] References Cited

U.S. PATENT DOCUMENTS 4,021,117 5/1977 Göhde et al. ...................... 377/50
4,167,677 9/1979 Suzki .................................. 356/401

Primary Examiner—R. A. Rosenberger
Attorney, Agent, or Firm—Fitzpatrick, Cella, Harper & Scinto

[57] ABSTRACT

Disclosed is a system to be used with a wafer provided with at least one first alignment mark and a mask provided with a plurality of second alignment marks. The system includes a detecting device for sensing the first and second alignment marks and putting out detection signals, a signal producing circuit producing a comparison signal, and a signal comparing and producing circuit for comparing the pulse width of the comparison signal with the pulse width of the detection signals and producing a plurality of substitute signals when the pulse width of the detection signal is greater than the pulse width of the comparison signal, wherein when the first and second alignment marks have come close to each other or partly overlapped each other, the respective alignment marks are discriminated.

8 Claims, 9 Drawing Figures

SYSTEM FOR DETECTING A SIGNAL FOR ALIGNING TWO BODIES AND SIGNAL PROCESSING METHOD

BACKGROUND OF THE INVENTION

1. Field of the Invention

This invention relates to a system for and method of aligning two bodies, and more particularly to a system for and method of aligning a mask and a wafer in a mask aligner used in the manufacture of semiconductor integrated circuits.

2. Description of the Prior Art

To align a mask and a wafer, there is known a system in which two or three groups of alignment marks are provided on the mask and wafer, respectively. These alignment marks are scanned by an emitted beam such as a laser beam or the like and the light energy scattered by the alignment marks is received and converted into an electrical signal stream. There is also known a system in which the images of alignment marks are picked up by a photosensor array or an image pickup tube of a television and the signals thereof are processed to obtain an alignment signal.

U.S. Pat. No. 4,167,677 describes that the alignment marks of a mask and a wafer are scanned by a laser beam or the like and the scattered light resulting therefrom is photoelectrically converted into electrical pulses and the positions of these pulses are measured by a counter or the like to thereby effect alignment.

For example, alignment marks M such as shown at (a) in FIG. 1 of the accompanying drawings are depicted on a mask while marks W such as shown at (b) in FIG. 1 are depicted on a wafer. These alignment marks M and W of the mask 1 and wafer 2 are scanned by a laser beam L in a device of the construction as illustrated in FIG. 2 of the accompanying drawings. The mask 1 and wafer 2 are finally aligned relative to each other, such as shown at (c) in FIG. 1. In this case, the wafer 2 placed on the stage 3 of FIG. 2 may usually be displaced relative to the mask 1 as shown, for example, at (d) in FIG. 1 before the aligning is effected. In this condition, when the alignment marks M and W of the mask 1 and wafer 2 are scanned in the direction of the arrow by the laser beam L emitted from a laser light source 6 and deflected by a deflector 4 comprising a polygon mirror or the like and a beam splitter 5, both shown in FIG. 2, the scattered light thereof travels back along the original optical path, passes through the beam splitter 5 and arrives at a photoelectric detector 8 through a condenser lens 7, whereby pulse signals as are shown at (e) in FIG. 1 are obtained by the detector 8. A control circuit 9 of FIG. 2 cuts these pulse signals by a suitable threshold voltage V by means of a comparator 10, such that from the pulse train shown at (f) in FIG. 1, the spacing between the alignment marks M and W is found and the amount of relative displacement of the mask 1 and wafer 2 is determined. Motors 11 and 12 are driven to operate the stage 3, thereby effecting aligning.

Generally, however, the signal obtained by the detector 8, namely, the scattered light from the marks M and W, is the sum $\ell_3$ of the scattered lights $\ell_1$ and $\ell_2$ from the opposite edges of the line 13 of the mark M, W as in enlarged form shown in Figure 3 of the accompanying drawings. The sum $\ell_3$ has a time expanse larger than the width $a$ of the actual mark. Therefore, when the alignment marks M and W have come close to each other as shown in Figure 4(a) of the accompanying drawings, the output of the detector 8 includes a portion in which the signals are superposed one upon the other like the waveform w shown in figure 4(b) of the accompanying drawings. In such condition, a proper positional relation cannot be found, and thus aligning is difficult. Heretofore, in such a case, the step of moving the mask 1 or the wafer 2 by trial and error until the pulse signal is separated into six or the step of increasing the threshold voltage V to V' up to a level whereat the pulse signal is separated has been necessary.

However, if an attempt is made to make the alignment marks M and W small, the probability that the alignment marks M and W of the mask 1 and wafer 2 come close to each other or overlap each other as shown in FIG. 4(a) during the setting of the wafer 2 becomes very high. Accordingly, if the marks M and W are made excessively small, there arises a problem that the by-trial-and-error driving is repeated and much time is required for aligning, or aligning cannot be accomplished. This problem forms a great barrier when the alignment marks M and W are to be made small.

SUMMARY OF THE INVENTION

It is an object of the present invention to enable information, suitable for effecting alignment, to be obtained even when the alignment mark of a first body and the alignment mark of a second body have come close to each other or a part or the whole of the alignment marks overlaps to make it impossible to obtain signals independent detection signal.

It is another object of the present invention to provide an alignment mark detecting method which, even when an independent detection signal cannot be obtained from the alignment marks of first and second bodies, enables the position of each mark to be found without repetitively effecting by-trial-and-error driving or without changing the threshold voltage and which, even when the marks competely overlap each other, enables the position of each mark to be found by a single by-trial-and-error driving of slight amount. A specific example, which will hereinafter be described, shows that or have partly overlapped each other, and the individual pulse widths are compared with a reference pulse width. When the individual pulse widths are greater than the reference pulse width, discrete substitute pulses are produced to thereby discriminate between the alignment marks of the mask and wafer.

DESCRIPTION OF THE PREFERRED EMBODIMENTS

The present invention will hereinafter be described in detail with respect to embodiments thereof shown in FIG. 5 and so on.

Figure 1:
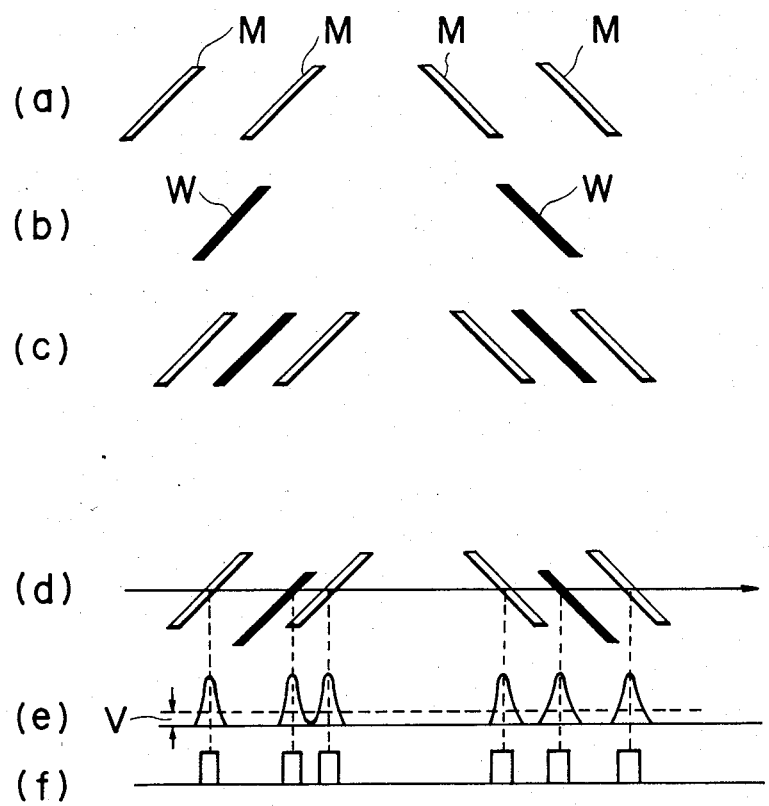
FIG. 1 illustrates the alignment mark detecting method according to the prior art.
Figure 2:
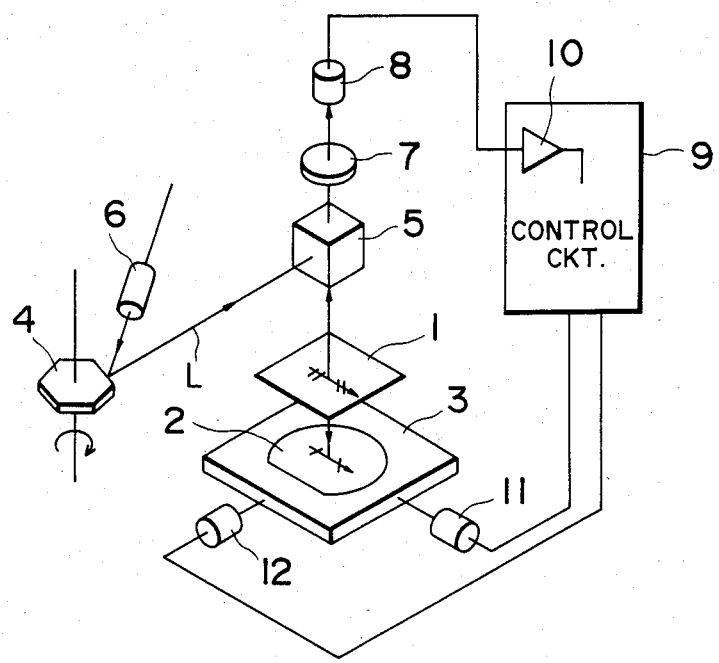
FIG. 2 shows the construction of the detecting apparatus according to the prior art.
Figure 3:
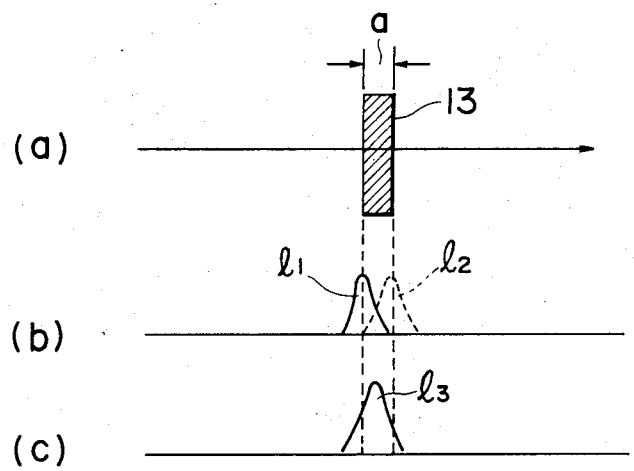
FIG. 3 illustrates the waveforms obtained from a mark.
Figure 4:
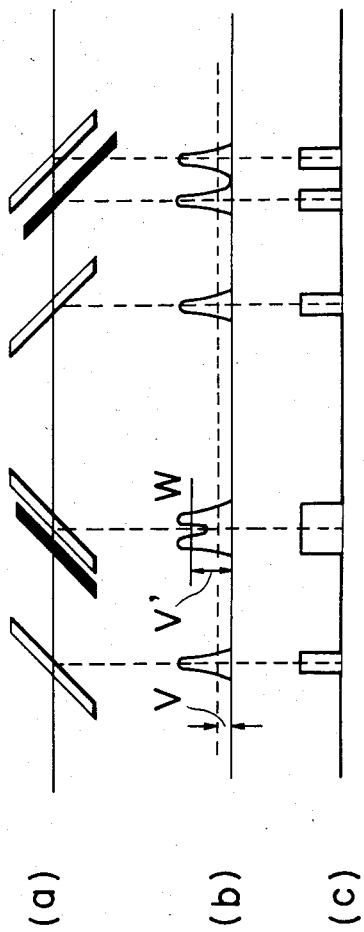
FIG. 4 illustrates the detection signal in a condition in which marks have come close to each other.
Figure 5:
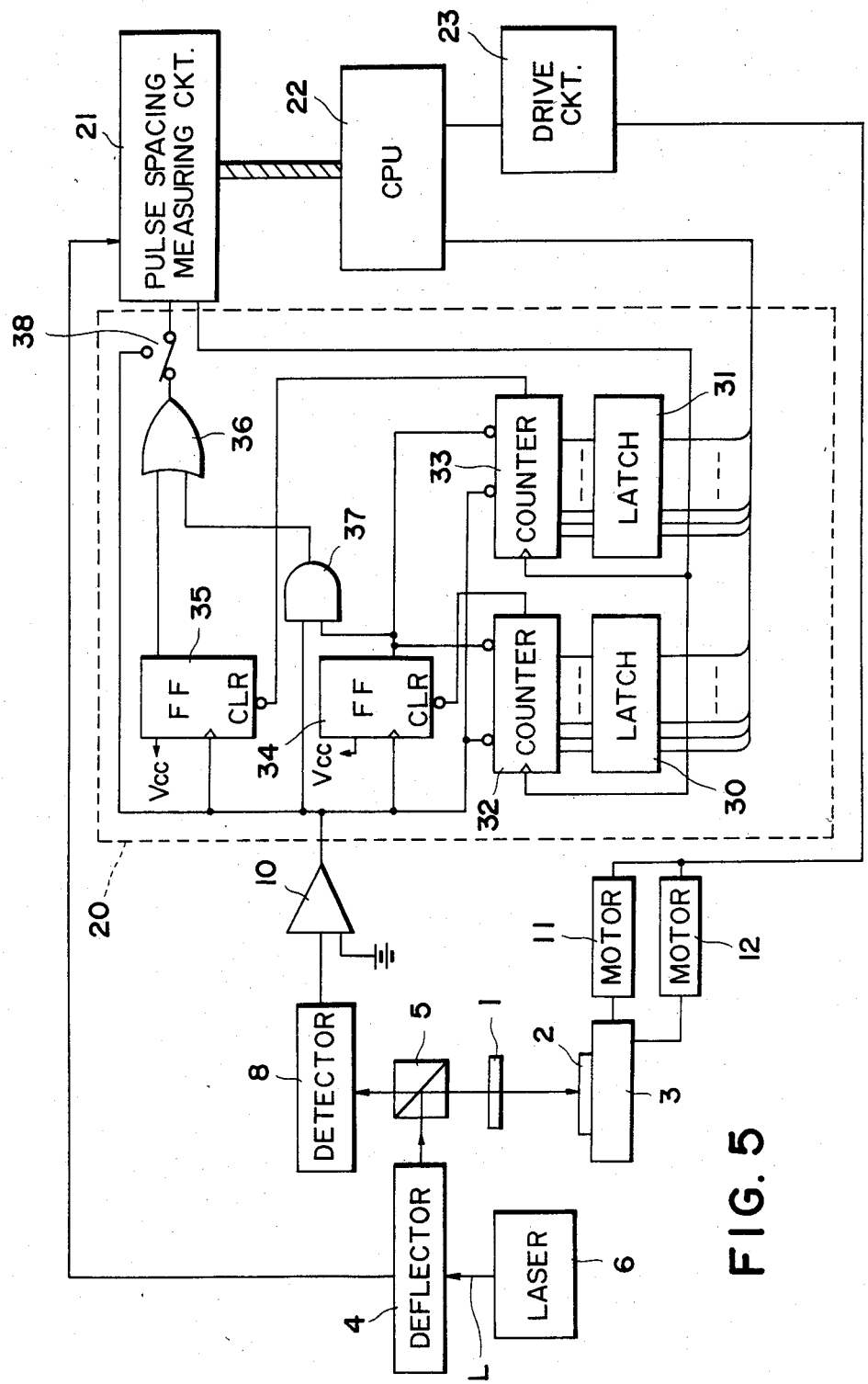
FIG. 5 shows the construction of an embodiment of the detecting circuit for realizing the method of the present invention.

FIG. 5 shows an embodiment of a device for realizing the method according to the present invention. In FIG. 5, reference numerals identical to those in FIG. 2 designate identical elements. The circuit encircled by a broken line is a pulse separating circuit 20, the output of which is input to a pulse spacing measuring circuit 21 together with a synchronizing signal of a deflector 4. This measuring circuit 21 is connected to a CPU 22 such as a microcomputer, and motors 11 and 12 for moving a stage 3 may be driven through a state driving circuit 23 operated on the basis of the instruction from the CPU 22.

Figure 6:
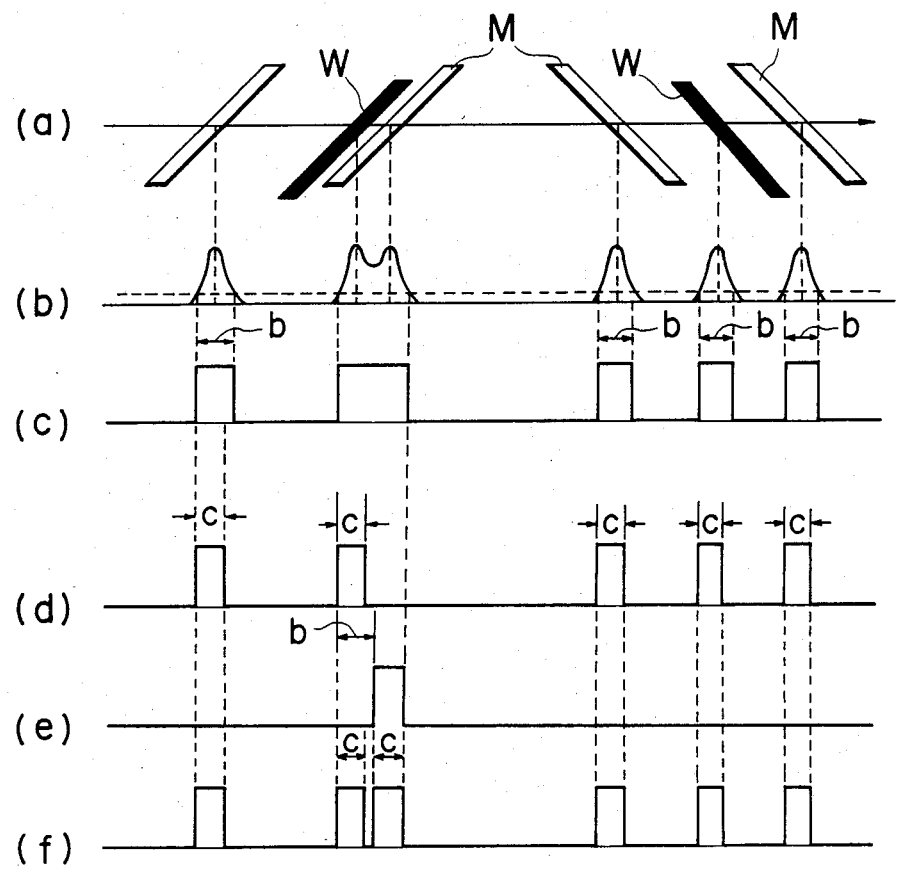
FIG. 6 illustrates the operative condition of the detecting circuit.

In the above-described construction, the laser light L emitted from a laser light source 6 is scattered by alignment marks M and W on a mask 1 and wafer 2 and detected by a detector 8. First, the CPU 22 sets a certain value in a latch 30 within the separating circuit 20 to provide a time corresponding to the signal width b from a mark shown in FIG. 6. The CPU 22 also sets another value in a latch 31 to provide a time c somewhat shorter than the signal width b. During a period of time in which the output of a comparator 10 is at low level, namely, during a period of time in which there is no signal from the marks M and W, a counter circuit 32 counts the time corresponding to the signal width b from the marks M and W by this presetting, with the setting of a flip-flop circuit (hereinafter referred to as the FF circuit) 34. On the other hand, a counter circuit 33 is preset with the counter circuit 32 and starts counting, and the amount of this count is a value c which is somewhat smaller than that of the counter circuit 32.

When the marks M and W on the mask 1 and wafer 2 approach each other as shown in FIG. 6(a), the output of the detector 8 appears as shown in FIG. 6(b). This detection signal passes through the comparator 10 such that pulse groups as shown in FIG. 6(c) are obtained. Each time these pulse groups arrive, FF circuits 34 and 35 are set. The counter circuit 33 clears the FF circuit 35 after the time c has elapsed and therefore, a waveform as shown in FIG. 6(d) appears at the input, from the FF circuit 35, of a logical sum gate 36. On the other hand, the counter circuit 32 resets the FF circuit 34 after the time b has elasped and, if the output level of the comparator 10 is a high level even thereafter, a logical multiply is established in a gate 37 and a waveform as shown in FIG. 6(e) appears at the output of the logical multiply gate 37, the output of which is applied to the logical sum gate 36. Accordingly, the separated pulses as shown in FIG. 6(f) are obtained as the output of the logical sum gate 36, namely, as the output to the pulse spacing measuring circuit 21. Thereafter, the CPU 22 calculates the amount of deviation between the mask 1 and the wafer 2 on the basis of the output of the pulse spacing measuring circuit 21 and drives the x-direction motor 11 and the y-direction motor 12 through the stage driving circuit 23, thereby effecting the aligning.

In each pulse shown in FIG. 6(d), the falling portion has an error, while in each pulse shown in FIG. 6(e), the rising portion has an error. However, when coarse aligning is effected with these errors neglected and the overlapped portions of FIG. 6(c) are separated, and whereafter the switch 38 of FIG. 5 is changed over by the signal from the CPU 22 and the detection signal from the detector 8 is again introduced, then the precise position of each mark M, W can be found so that fine alignment is accomplished.

Figure 7:
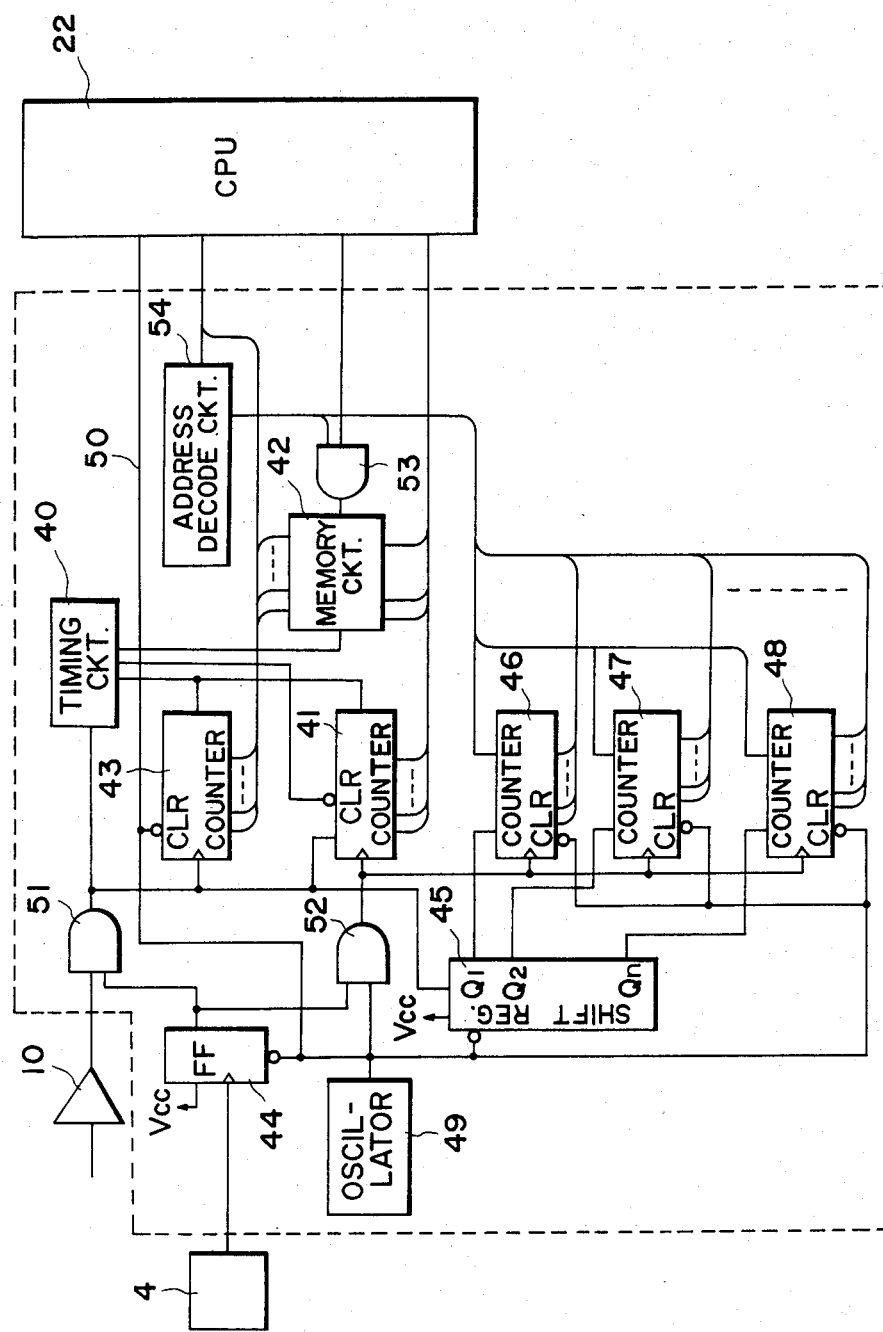
FIG. 7 shows the construction of another embodiment of the detecting circuit.

FIG. 7 shows an embodiment of the device for realizing the method of the invention wherein the rising position of each pulse and the pulse width thereof are measured to be introduced into the CPU 22. In FIG. 7, reference numeral 40 designates a timing circuit generating a timing for writing the count of a pulse width measuring counter circuit 41 into a memory circuit 42 on the basis of the input pulse signal from the comparator 10, and reference numeral 43 denotes an address counter circuit for counting up upon arrival of each pulse from the comparator 10 and renewing the address of the memory circuit 42. Reference numeral 44 designates an FF circuit adapted to be set by the synchronizing signal from the deflector 4. Reference numeral 45 denotes a shift register for making outputs $Q_1$-$Q_n$ sucessively into a high level upon arrival of each signal pulse and stopping pulse position measuring counter circuits 46-48, and reference numeral 49 designates a measuring clock oscillator.

In the above-described construction, the CPU 22 first clears the FF circuit 44, the shift register 45 and each counter circuit by a clear line 50. Subsequently, the FF circuit 44 is set by the synchronizing signal from the deflector 4 and opens logical multiply gates 51 and 52, whereupon six counter circuits start counting. When a pulse signal is input from the comparator 10, the counter circuit 41 measures the period of time during which said pulse signal is at high level, and the counter circuit 46 stops measuring by the high level of the $Q_1$ output of the shift register 45. The value of the counter circuit 41 is written into the memory circuit 42 by the timing circuit 40 after the output of the comparator 10 has restored low level. The memory address into which said value is written is designated by the address counter 43. Thereafter, till the termination of the sixth pulse signal, the address counter 43 counts up for each pulse, thereby renewing the address of the memory circuit 42, and the measured value of the counter circuit 41 is stored in that address. Also, upon arrival of each pulse signal, the counter circuits 46-48 store the rising position thereof and stop in succession. Reference numeral 53 designates a logical multiply gate, and reference numeral 54 denotes an address decode circuit. After termination of the scanning, the CPU 22 reads out the values of the memory circuit 42 and counter circuits 46-48 and, if there are any superposed signals from the marks which have approached each other, the CPU 22 separates these signals.

Figure 8:
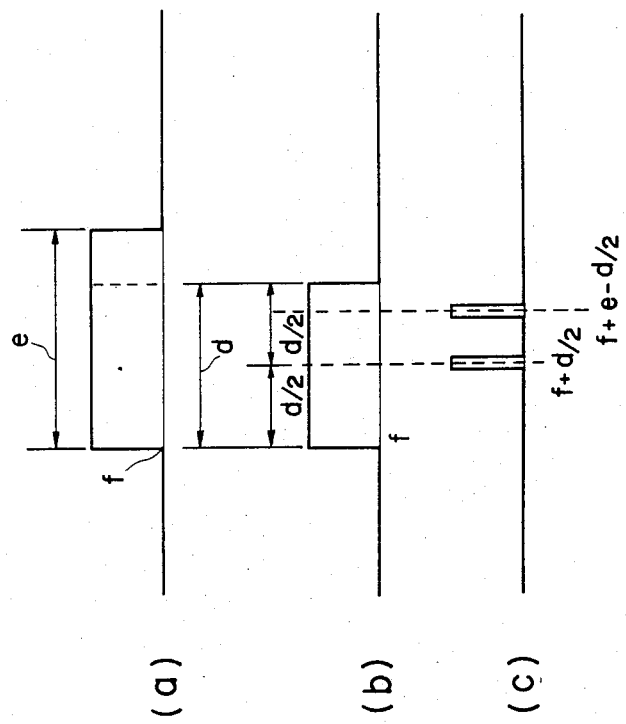
FIG. 8 illustrates a case where superposed signals are processed.

The processing thereof will now be described. Let it be assumed that one of the measured pulses has a value $e$ wider than the reference width $d$ to be obtained from an alignment mark, as shown in FIG. 8(a). In this case, the CPU judges it as the overlap of two pulses and calculates the center values $f+(d/2)$ and $f+e-(d/2)$ of two pulses on the basis of the rising position $f$ and reference width $d$ of the pulse measured by the counter circuit. From the thus detected positions considered as the central positions of the marks as shown in FIG. 8(c), the amount of deviation between the mask 1 and waver 2 is found, whereby alignment is effected.

Figure 9:
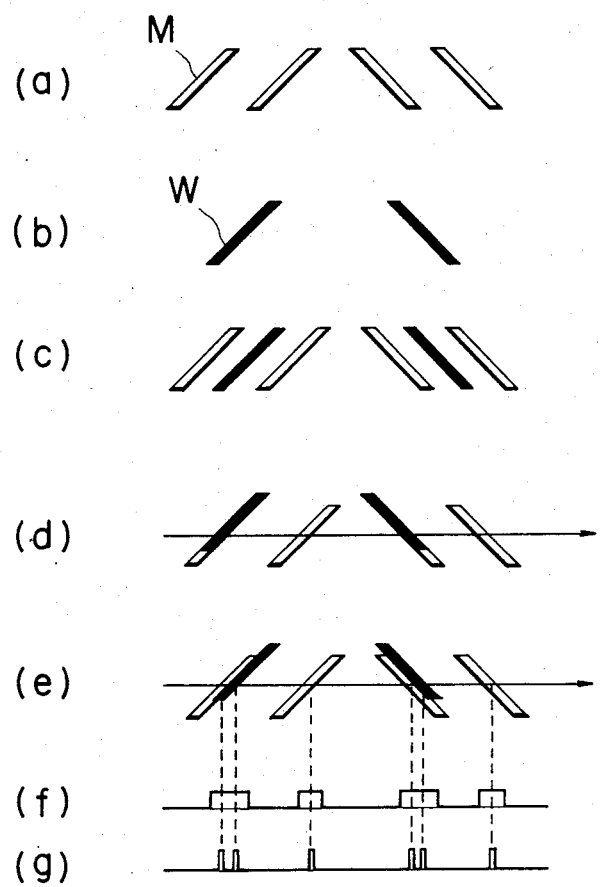
FIG. 9 illustrates the processing effected in case marks have completely overlapped each other.

In case alignment is to be effected, as shown in FIG. 9(c), by the use of, for example, the alignment marks M and W as shown in FIGS. 9(a) and (b) and when the marks M and W of the mask 1 and wafer 2 completely overlap each other as shown in FIG. 9(d), only slight movement of one of the mask 1 and the waver 2 such as shown in FIG. 9(e) will provide a signal such as shown in FIG. 9(f). From this, the position of each mark M, W can be found immediately, such as shown at (g) in FIG. 9, and thus, the alignment marks M and W can be made substantially smaller than conventional ones, or, the spacing between the lines of the marks M and W can be reduced.

In the foregoing description, a case where the widths of the lines of the alignment marks M and W of the mask 1 and wafer 2 are the same has been assumed, but even when the widths of the lines of the marks M and W ofthe mask 1 and wafer 2 differ from each other, processing can be effected by the CPU 22 without any problem if the mask 1 and wafer 2 are manually adjusted into their aligned state during the setting of the mask 1 and design is made such that the CPU 22 introduces the then pulse widths. In this case, the wider signal width of one of the lines of the marks M and W of the mask 1 and wafer 2 is introduced as the reference width b. The above-described two embodiments show the case where the present invention is applied to a method of measuring the spacings between the six pulses from the alignment marks M and W of the mask 1 and wafer 2 and therby finding the amount of displacement of the mask 1 and wafer 2, but the method of the present invention is basically applicable independently of the number, shape, etc. ofthe patterns of the alignment marks M and W thereof. Even in case a television monitor is employed as the alignment mark scanning detector, the method of the present invention can separate the marks M and W of the mask 1 and wafer 2 into two signals even if these marks partly overlap each other. Also, these embodiments show the case where the two marks M and W have come close to each other, but a similar conception is applicable even in case three or more marks have come close to one another or partly overlapped one another.

As described above, the alignment mark detecting method according to the present invention pays attention to the pulse signal widths from the alignment marks and adopts a system in which means is provided for automatically generating a second pulse with respect to a pulse having a pulse width wider than a certain standard pulse width or which measures the pulse width, separates the signal and forecasts the position whereat the signal is to lie. Accordingly, even for the superposed signals from the marks which have come close to each other, the alignment marks position thereof can be detected without increasing the threshold voltage or effecting the driving by trial and error and without providing discrete detecting optical systems for the mask and the wafer.

WE CLAIM:

1. A signal detecting system to be used with a first body provided with at least one first alignment mark and a second body provided with a plurality of second alignment marks, said system comprising:

detector means for detecting said first and second alignment marks and *for* putting out detection signals *representative thereof*;

means *for* producing a comparison signal; and signal producing means for comparing the pulse width of said comparison signal with the pulse width of each of said detection signals and *for* producing a plurality of substitute signals when the pulse width of *any one of* said detection signals is greater than the pulse width of said comparison signal.

2. A system *according* to Claim 1, wherein *said signal producing means produces* a first one of said substitute signals at the rising position of the *one* detection signal having a pulse width greater than that of said comparison signal, and *said signal producing means produces* a second one of said substitute signals after the lapse of the signal width of said comparison signal.

3. A system according to Claim 2, wherein the signal width *b* of said comparison signal *produced by said comparison signal producing means* is equal to the signal width of one of the *detection* signals, *put out by said detector means* detecting said first and second alignment marks independently, which is *greatest* in signal width.

4. A system according to Claim 2, wherein the signal width of said comparison signal *produced by said comparison signal producing means* is *greater* than the signal width of said substitute signals *produced by said signal producing means.*

5. A system according to Claim 1, wherein said signal producing means converts the signal width of said detection signals into a *width* equal to the signal width of said substitute signals.

6. A system according to Claim 1, wherein when the signal width of said comparison signal *produced by said comparison signal producing means is e;* the signal width of one of the signals, *produced by said detecting means* detecting said first and second alignment marks, which is *greatest* in signal width is *d;* and the rising position of the detection signal having a pulse width greater than that of said comparison signal is *f,* the center positions of two substitute signals *produced by said signal producing means* are F+[d/2] *(d/2)* and f+e−*(d/2),* respectively.

7. An alignment signal processing method comprising the steps of:

detecting a first alignment mark of a first body and a second alignment mark of a second body and forming detection signals *representative of the detection*;

producing a comparison signal;

and comparing the pulse width of said comparison signal with the pulse width of each of said detection signals and separating said detection signal into a plurality of *substitute* signals when the pulse width of said detection signal is greater than the pulse width of said comparison signal.

8. A method according to Claim 7, wherein the signal width of said comparison signal is equal to the signal width of *the* one of the *detection* signals, obtained by detecting said first and second alignment marks independently, which is *greatest* in signal width.

* * * * *

UNITED STATES PATENT AND TRADEMARK OFFICE
CERTIFICATE OF CORRECTION

PATENT NO. : 4,504,148

DATED : March 12, 1985

INVENTOR(S) : YOICHI KUROKI, ET AL.

It is certified that error appears in the above-identified patent and that said Letters Patent is hereby corrected as shown below:

Column 1

Line 28, after "pulses" insert --.--, and delete "and",

Line 29, change "the" to --The--.

Column 2

Line 46, before "or have partly", insert --in a method of scanning the alignment marks on a mask and a wafer and detecting the relative position of the mask and wafer, pulse signals are obtained from the alignment marks which have come close to each other--, --.

Column 5

Line 21, change "ofthe" to --of the--.

UNITED STATES PATENT AND TRADEMARK OFFICE
CERTIFICATE OF CORRECTION

PATENT NO. : 4,504,148

DATED : March 12, 1985

INVENTOR(S) : YOICHI KUROKI, ET AL.

It is certified that error appears in the above-identified patent and that said Letters Patent is hereby corrected as shown below:

Column 5 (continued)

Line 36, change "ofthe" to --of the--.

Signed and Sealed this

Third Day of December 1985

[SEAL]

Attest:

Attesting Officer

DONALD J. QUIGG

Commissioner of Patents and Trademarks